(12) United States Patent
Low et al.

(10) Patent No.: US 6,861,748 B2
(45) Date of Patent: Mar. 1, 2005

(54) TEST STRUCTURE

(75) Inventors: Qwai H. Low, Cupertino, CA (US); Ramaswamy Ranganathan, Saratoga, CA (US); Rey Torcuato, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 87 days.

(21) Appl. No.: 10/298,971

(22) Filed: Nov. 18, 2002

(65) Prior Publication Data

US 2004/0096995 A1 May 20, 2004

(51) Int. Cl.[7] .......................... H01L 23/48; H01L 23/52; H01L 29/40
(52) U.S. Cl. ........................................ 257/734; 257/786
(58) Field of Search .............................. 257/734, 737, 257/738, 774, 778, 779, 784, 786

(56) References Cited

U.S. PATENT DOCUMENTS 5,789,271 A * 8/1998 Akram .......................... 438/18

* cited by examiner

*Primary Examiner*—Phuc T. Dang
(74) *Attorney, Agent, or Firm*—Luedeka, Neely & Graham, P.C.

(57) ABSTRACT

A test structure for an integrated circuit having a first underlying conductive layer. A first nonconductive layer is disposed over the first underlying conductive layer, and a first overlying conductive layer is disposed over the first nonconductive layer. First conductive vias form electrical connections between the first underlying conductive layer and the first overlying conductive layer. A second overlying conductive layer is disposed over the first nonconductive layer, but the second overlying conductive layer does not make electrical connections to the first underlying conductive layer. The test structure also has a second underlying conductive layer. A second nonconductive layer is disposed over the second underlying conductive layer, with a third overlying conductive layer disposed over the second nonconductive layer. The third overlying conductive layer does not make electrical connections to the second underlying conductive layer. A fourth overlying conductive layer is disposed over the second nonconductive layer, and second conductive vias form electrical connections between the second underlying conductive layer and the fourth overlying conductive layer. First conductive traces form electrical connections between the first overlying conductive layer and the third conductive layer, and second conductive traces form electrical connections between the second overlying conductive layer and the fourth conductive layer.

10 Claims, 1 Drawing Sheet

TEST STRUCTURE

FIELD

This invention relates to the field of integrated circuit fabrication. More particularly, this invention relates to test structures for determining defects in the integrated circuits.

BACKGROUND

Integrated circuits are extremely complex devices, with multiple interrelated and often competing design goals. As integrated circuits have become increasing smaller and faster, an increasing number of the design goals have been discovered to be competing, which tends to require that new techniques, structures, and materials be used in integrated circuit fabrication to overcome the new challenges that arise.

Integrated circuits are typically packaged prior to use, so as to protect the monolithic integrated circuit from damage during subsequent handling or operation. Thus, the package protects the integrated circuit, while also conveniently providing for electrical connections and structural connections to the integrated circuit. Some integrated circuits are electrically connected to the package substrate by a method called wire bonding. A wire bonded integrated circuit is electrically connected to the package substrate to which it is structurally mounted by thin metal wires, such as gold wires.

The wires are bonded to electrically conductive bonding pads on the integrated circuit with a method such as heat or ultrasonic vibration. Regardless of the specific wire bonding method used, a certain amount of pressure is applied by the bonding tip to the bonding pad during the bonding process. If the bonding process is not carefully controlled, or if there are slight variations in the structural strength of the bonding pads or the various layers disposed beneath the bonding pads, then the pressure applied by the bonding tip during the bonding process may be sufficient to crack and otherwise damage the delicate layers of the integrated circuit.

While such damage has always been a problem, the new materials required by modem, denser integrated circuit designs tend to increase the likelihood of such damage. For example, because electrically conductive structures are placed increasingly closer to each other, an increasing problem with parasitic capacitance has arisen. Thus, new electrically insulating materials have been used between the electrically conductive structures, to reduce such capacitance problems. The new electrically insulating materials typically have lower dielectric constants, and thus are generally referred to as low k materials. While low k dielectrics tend to help resolve the capacitance problems described above, they unfortunately tend to introduce new challenges, because they tend to be somewhat softer than the materials that they replaced, and thus have reduced structural strength.

For example, when low k materials are used as dielectrics between a bonding pad and an underlying electrically conductive layer, the pressure exerted by a bonding tip can readily crack the low k layer, resulting in electrical shorts and other problems. In addition, low k materials tend to have lower adhesive properties than the materials they replaced. This tends to increase bonding pad delamination when the probe tip lifts off the bonding pad after a bonding process. Traditionally, failures such as these have been difficult to detect without cross sectioning the integrated circuit. Because such a process is very time consuming, and therefore expensive, and is also destructive, only a relatively low number of integrated circuits could be checked in this manner.

What is needed, therefore, is a system by which integrated circuits can be readily checked in a non destructive manner for defects induced such as during a bonding process, and most especially when low k materials are used as dielectrics between bonding pads and underlying electrically conductive layers.

SUMMARY

The above and other needs are met by a test structure for an integrated circuit having a first underlying electrically conductive layer. A first electrically nonconductive layer is disposed over the first underlying electrically conductive layer, and a first overlying electrically conductive layer is disposed over the first electrically nonconductive layer and the first underlying electrically conductive layer. First electrically conductive vias form electrical connections through the first electrically nonconductive layer between the first underlying electrically conductive layer and the first overlying electrically conductive layer. A second overlying electrically conductive layer is disposed over the first electrically nonconductive layer and the first underlying electrically conductive layer, but the second overlying electrically conductive layer does not make electrical connections through the first electrically nonconductive layer to the first underlying electrically conductive layer.

The test structure also has a second underlying electrically conductive layer. A second electrically nonconductive layer is disposed over the second underlying electrically conductive layer, with a third overlying electrically conductive layer disposed over the second electrically nonconductive layer and the second underlying electrically conductive layer. The third overlying electrically conductive layer does not make electrical connections through the second electrically nonconductive layer to the second underlying electrically conductive layer. A fourth overlying electrically conductive layer is disposed over the second electrically nonconductive layer and the second underlying electrically conductive layer, and second electrically conductive vias form electrical connections through the second electrically nonconductive layer between the second underlying electrically conductive layer and the fourth overlying electrically conductive layer.

First electrically conductive traces form electrical connections between the first overlying electrically conductive layer and the third electrically conductive layer, and second electrically conductive traces form electrical connections between the second overlying electrically conductive layer and the fourth electrically conductive layer.

In this manner, bonding damage can be detected electrically in the test structure. For example, if there is no electrical continuity between the first and third overlying electrically conductive layers, then one or the other is presumed to have delaminated during bonding. Similarly, if there is no electrical continuity between the second and fourth overlying electrically conductive layers, then again one or the other is presumed to have delaminated during bonding.

Further, if there is electrical continuity between the first and the second overlying electrically conductive layers, then it is presumed that the first electrically nonconductive layer has cracked. Finally, if there is electrical continuity between the third and the fourth overlying electrically conductive layers, then it is presumed that the second electrically nonconductive layer has cracked. Thus, cracking and delamination, such as from a bonding process, can be electrically detected without destroying the integrated circuit. Therefore, more integrated circuits can be tested for such problems, and the time and cost associated with such testing is reduced.

In various preferred embodiments of the invention, the first, second, third, and fourth overlying electrically conductive layers are bonding pads formed of copper, and the first and second electrically nonconductive layers are low k layers. Preferably, the first and second underlying electrically conductive layers are both formed of copper. Also described is an integrated circuit with the test structure as described above.

According to another aspect of the invention there is described a method for electrically detecting bonding pad problems. A test structure as described above is formed on an integrated circuit. A first electrical connection, a second electrical connection, a third electrical connection, and a fourth electrical connection are respectively formed to the first overlying electrically conductive layer, the second overlying electrically conductive layer, the third overlying electrically conductive layer, and the fourth overlying electrically conductive layer.

Electrical continuity is checked between the first overlying electrically conductive layer and the third overlying electrically conductive layer, and when no electrical continuity is found, the lack of electrical continuity is ascribed to delamination of at least one of the first overlying electrically conductive layer and the second overlying electrically conductive layer. Electrical continuity is also checked between the second overlying electrically conductive layer and the fourth overlying electrically conductive layer, and when no electrical continuity is found, the lack of electrical continuity is ascribed to delamination of at least one of the second overlying electrically conductive layer and the fourth overlying electrically conductive layer.

A preferred embodiment of the method described above also includes checking for electrical continuity between the first overlying electrically conductive layer and the second overlying electrically conductive layer, and when electrical continuity is found, ascribing the electrical continuity to cracking of the first electrically nonconductive layer. Electrical continuity is preferably also checked between the third overlying electrically conductive layer and the fourth overlying electrically conductive layer, and when electrical continuity is found, the electrical continuity is ascribed to cracking of the second electrically nonconductive layer.

Most preferably, the first electrically nonconductive layer and the second electrically nonconductive layer are low k layers. The first, second, third, and fourth overlying electrically conductive layers are preferably all formed of copper, and the first and second underlying electrically conductive layers are also both formed of copper.

According to yet another aspect of the invention, there is described a method for electrically detecting cracking in a low k layer. A test structure as described above is formed on an integrated circuit, where the first and second electrically nonconductive layers are low k layers. A first, second, third, and fourth electrical connection are respectively formed to the first, second, third, and fourth overlying electrically conductive layers. Electrical continuity is checked between the first overlying electrically conductive layer and the second overlying electrically conductive layer, and when electrical continuity is found, it is ascribed to cracking of the first electrically nonconductive low k layer. Electrical continuity is checked between the third overlying electrically conductive layer and the fourth overlying electrically conductive layer, and when electrical continuity is found, the electrical continuity is ascribed to cracking of the second electrically nonconductive low k layer.

In a preferred embodiment, electrical continuity is also checked between the first overlying electrically conductive layer and the third overlying electrically conductive layer, and when no electrical continuity is found, the lack of electrical continuity is ascribed to delamination of at least one of the first overlying electrically conductive layer and the second overlying electrically conductive layer. Electrical continuity is preferably further checked between the second overlying electrically conductive layer and the fourth overlying electrically conductive layer, and when no electrical continuity is found, the lack of electrical continuity is ascribed to delamination of at least one of the second overlying electrically conductive layer and the fourth overlying electrically conductive layer.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
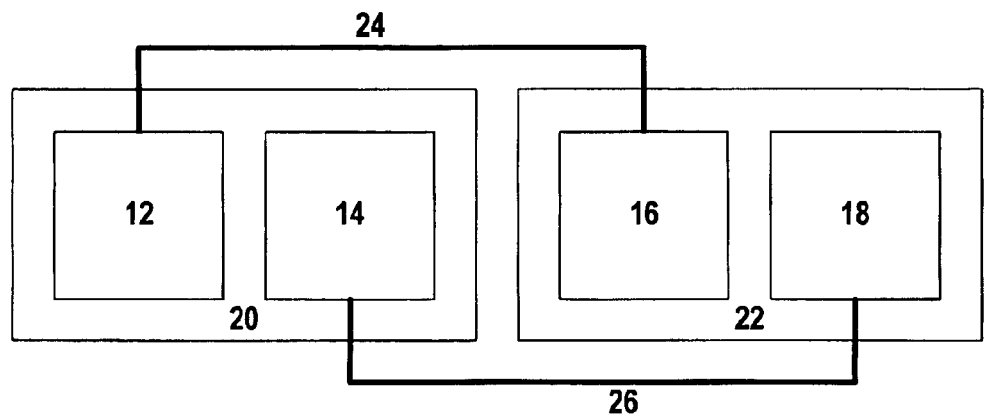
FIG. 1 is a top plan view of a test structure according to the present invention, formed on a portion of an integrated circuit.

With reference now to FIG. 1 there is depicted a top plan view of a test structure according to the present invention, formed on a portion of an integrated circuit 10. The test structure includes a first underlying electrically conductive layer 20 and a second underlying electrically conductive layer 22. Preferably, the first and second underlying electrically conductive layers 20 and 22 are electrically isolated one from the other. A first overlying electrically conductive layer 12 overlies the first underlying electrically conductive layer 20, and a second overlying electrically conductive layer 14 also overlies the first underlying electrically conductive layer 20. Preferably, the first and second overlying electrically conductive layers 12 and 14 are electrically isolated one from the other.

A third overlying electrically conductive layer 16 overlies the second underlying electrically conductive layer 22, and a fourth overlying electrically conductive layer 18 also overlies the second underlying electrically conductive layer 22. Preferably, the third and fourth overlying electrically conductive layers 16 and 18 are electrically isolated one from the other. A first electrically conductive trace 24 preferably electrically connects the first overlying electrically conductive layer 12 and the third overlying electrically conductive layer 16, and a second electrically conductive trace 26 preferably electrically connects the second overlying electrically conductive layer 14 and the fourth overlying electrically conductive layer 18.

Figure 2:
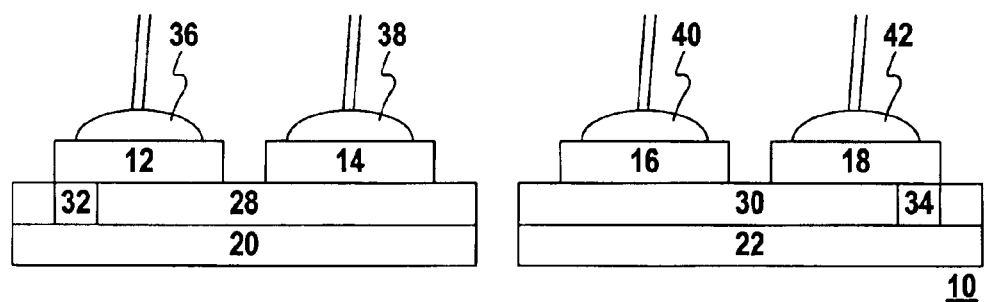
FIG. 2 is a cross sectional view of a test structure according to the present invention, formed on a portion of an integrated circuit.

As can be more readily seen in FIG. 2, a first electrically nonconductive layer 28 is disposed between the first underlying electrically conductive layer 20 and the first and second overlying electrically conductive layers 12 and 14, and a second electrically nonconductive layer 30 is disposed between the second underlying electrically conductive layer 22 and the third and fourth overlying electrically conductive layers 16 and 18. Further, first electrically conductive vias 32 extend through the first electrically nonconductive layer 28 from the first overlying electrically conductive layer 12 to the first underlying electrically conductive layer 20. Similarly, second electrically conductive vias 34 extend through the second electrically nonconductive layer 30 from the fourth overlying electrically conductive layer 18 to the second underlying electrically conductive layer 22.

The first, second, third, and fourth overlying electrically conductive layers 12, 14, 16, and 18 are preferably adapted to receive electrical connections, such as the first, second, third, and fourth ball bonds 36, 38, 40, and 42 respectively, and are most preferably bonding pads of the type used elsewhere on the integrated circuit 10. Thus, the various electrical connections 36, 38, 40, and 42 can be tested for electrical continuity, one to another.

Therefore, if all of the structures are properly formed, and the test structure has not suffered any damage, there should be electrical continuity between the first overlying electrically conductive layer 12 and the third overlying electrically conductive layer 16 via the first electrically conductive trace 24, and also between the second overlying electrically conductive layer 14 and the fourth electrically conductive layer 18 via the second electrically conductive trace 26. Conversely, there should be no electrical continuity between any of the other contact combinations.

In preferred embodiments, the electrically conductive layers are all formed of copper, or another metal or electrically conductive material that the bonding pads and underlying electrically conductive layers throughout the rest of the integrated circuit 10 are formed of. Further, the first and second electrically nonconductive layers 28 and 30 are preferably formed of the same dielectric material that is used elsewhere throughout the integrated circuit 10 to electrically isolate different electrically conductive structures, and are most preferably formed of a low k material.

The test structure is used by checking for electrical continuity between the first, second, third, and fourth electrical contacts 36, 38, 40, and 42. If no electrical continuity is found between the first overlying electrically conductive layer 12 and the third overlying electrically conductive layer 16, then it is ascribed to delamination of either the first or the third overlying electrically conductive layer 12 or 16, such as occurs when the bonding tip is pulled away after forming the ball bond. Similarly, if no electrical continuity is found between the second overlying electrically conductive layer 14 and the fourth overlying electrically conductive layer 18, then it is ascribed to delamination of either the second or the fourth overlying electrically conductive layer 14 or 18, such as occurs when the bonding tip is pulled away after forming the ball bond.

On the other hand, if electrical continuity is found between the first overlying electrically conductive layer 12 and the second overlying electrically conductive layer 14, then it is ascribed to cracking of the first underlying electrically nonconductive layer 20 underneath the second electrically conductive layer 14, such as occurs when pressure is applied by the bonding tip when forming the ball bond for the second electrical connection 38. Similarly, if electrical continuity is found between the third overlying electrically conductive layer 16 and the fourth overlying electrically conductive layer 18, then it is ascribed to cracking of the second underlying electrically nonconductive layer 22 underneath the third electrically conductive layer 16, such as occurs when pressure is applied by the bonding tip when forming the ball bond for the third electrical connection 40.

If these problems are detected in the test structure, than it is further anticipated that such problems also exist in the functional bonding pads disposed elsewhere on the integrated circuit 10. Thus, the test structure of the present invention provides for electrical testing for both bonding pad delamination and dielectric cracking problems such as from bonding operations. Therefore, these problems can be readily detected without cross sectioning or otherwise destroying the integrated circuit. In this manner, a greater number of integrated circuits can be tested for these conditions, without incurring a large cost or expending a great amount of time.

It is appreciated that the structures as described and depicted herein are representative, and do not necessarily have the shape or are otherwise configured exactly as depicted. For example, there may be many vias which are used to electrically connect an overlying electrically conductive layer with an underlying electrically conductive layer, rather than just a single via as depicted. Further, the underlying layers may or may not be larger than the overlying layers. In addition, the underlying layers may have an appearance of somewhat discrete lands underneath the overlying layers, which somewhat discrete lands are electrically connected such as by electrically conductive traces. Thus, the embodiments as depicted and described are by way of example, and not necessarily by way of limitation.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A test structure for an integrated circuit, the test structure comprising:

a first underlying electrically conductive layer, a first electrically nonconductive layer disposed over the first underlying electrically conductive layer, a first overlying electrically conductive layer disposed over the first electrically nonconductive layer and the first underlying electrically conductive layer, first electrically conductive vias forming electrical connections through the first electrically nonconductive layer between the first underlying electrically conductive layer and the first overlying electrically conductive layer, a second overlying electrically conductive layer disposed over the first electrically nonconductive layer and the first underlying electrically conductive layer, the second overlying electrically conductive layer not making electrical connections through the first electrically nonconductive layer to the first underlying electrically conductive layer, a second underlying electrically conductive layer, a second electrically nonconductive layer disposed over the second underlying electrically conductive layer, a third overlying electrically conductive layer disposed over the second electrically nonconductive layer and the second underlying electrically conductive layer, the third overlying electrically conductive layer not making electrical connections through the second electrically nonconductive layer to the second underlying electrically conductive layer, a fourth overlying electrically conductive layer disposed over the second electrically nonconductive layer and the second underlying electrically conductive layer, second electrically conductive vias forming electrical connections through the second electrically nonconductive layer between the second underlying electrically conductive layer and the fourth overlying electrically conductive layer, first electrically conductive traces forming electrical connections between the first overlying electrically conductive layer and the third overlying electrically conductive layer, and second electrically conductive traces forming electrical connections between the second overlying electrically conductive layer and the fourth overlying electrically conductive layer.

2. The test structure of claim 1, wherein the first overlying electrically conductive layer is a bonding pad.

3. The test structure of claim 1, wherein the second overlying electrically conductive layer is a bonding pad.

4. The test structure of claim 1, wherein the third overlying electrically conductive layer is a bonding pad.

5. The test structure of claim 1, wherein the fourth overlying electrically conductive layer is a bonding pad.

6. The test structure of claim 1, wherein the first electrically nonconductive layer is a low k layer.

7. The test structure of claim 1, wherein the second electrically nonconductive layer is a low k layer.

8. The test structure of claim 1, wherein the first overlying electrically conductive layer, the second overlying electrically conductive layer, the third overlying electrically conductive layer, and the fourth overlying electrically conductive layer are all formed of copper.

9. The test structure of claim 1, wherein the first underlying electrically conductive layer, and the second underlying electrically conductive layer are both formed of copper.

10. An integrated circuit, the improvement comprising the test structure of claim 1.

* * * * *